United States Patent
Yamamoto

(10) Patent No.: US 9,380,736 B2
(45) Date of Patent: Jun. 28, 2016

(54) ELECTROMAGNETIC INTERFERENCE SUPPRESSOR

(75) Inventor: Kazumi Yamamoto, Otake (JP)

(73) Assignee: TODA KOGYO CORPORATION, Hiroshima (JP)

(*) Notice: Subject to any disclaimer, the term of this patent is extended or adjusted under 35 U.S.C. 154(b) by 0 days.

(21) Appl. No.: 14/126,912

(22) PCT Filed: Jun. 14, 2012

(86) PCT No.: PCT/JP2012/065243
§ 371 (c)(1),
(2), (4) Date: Jan. 30, 2014

(87) PCT Pub. No.: WO2012/173188
PCT Pub. Date: Dec. 20, 2012

(65) Prior Publication Data
US 2014/0141220 A1   May 22, 2014

(30) Foreign Application Priority Data

Jun. 17, 2011 (JP) ................................. 2011-135785
Mar. 27, 2012 (JP) ................................. 2012-072167

(51) Int. Cl.
| | | |
|---|---|---|
| *B32B 7/02* | (2006.01) | |
| *D06N 7/04* | (2006.01) | |
| *A61F 13/15* | (2006.01) | |
| *B32B 27/32* | (2006.01) | |
| *B32B 15/04* | (2006.01) | |
| *B32B 15/00* | (2006.01) | |
| *H05K 9/00* | (2006.01) | |

(52) U.S. Cl.
CPC ........ *H05K 9/0088* (2013.01); *Y10T 428/24967* (2015.01); *Y10T 428/31678* (2015.04); *Y10T 428/31938* (2015.04); *Y10T 428/32* (2015.01)

(58) Field of Classification Search
CPC ................... H05K 9/0088; Y10T 428/24967; Y10T 428/32; Y10T 428/31678; Y10T 428/31938
USPC ....................... 428/212–220, 457, 692.1, 523; 252/502, 511
See application file for complete search history.

(56) References Cited

U.S. PATENT DOCUMENTS

| | | | | |
|---|---|---|---|---|
| 5,938,979 A * | 8/1999 | Kambe | ...................... | H01F 1/36 174/126.2 |
| 2004/0020674 A1* | 2/2004 | McFadden | ........... | H05K 9/0088 174/394 |
| 2009/0114440 A1* | 5/2009 | Yamamoto et al. | ........... | 174/391 |

FOREIGN PATENT DOCUMENTS

| | | | |
|---|---|---|---|
| JP | 2003-324299 | | 11/2003 |
| JP | 2006-037078 | | 2/2006 |
| JP | 2006-196747 | | 7/2006 |
| JP | 2007-019287 | | 1/2007 |
| JP | 2007019287 A | * | 1/2007 |
| JP | 2010-153542 | | 7/2010 |
| JP | 2010153542 A | * | 7/2010 |

OTHER PUBLICATIONS

Machine Translation JP 2007019287 A.*
Machine Translation JP 2010153542 A.*
English language translation of International Preliminary Report on Patentability in PCT/JP2012/065243 dated Jan. 3, 2014.
International Search Report for PCT/JP2012/065243, mailed Sep. 18, 2012.
Extended European Search Report issued in Application No. 12801294.5 dated Jan. 4, 2016.

* cited by examiner

*Primary Examiner* — Maria Veronica Ewald
*Assistant Examiner* — Travis Figg
(74) *Attorney, Agent, or Firm* — Nixon & Vanderhye P.C.

(57) ABSTRACT

According to the present invention, there are provided an electromagnetic interference suppression material capable of exhibiting a good low-pass filter characteristic in an extensive frequency band ranging from a low frequency to a high frequency, and an electromagnetic interference suppression sheet using the electromagnetic interference suppression material. When laminating a conductive layer having a surface electrical resistance of 100 to 5000Ω/☐ in which 5 to 25% by volume of a conductive carbon is mixed, and a magnetic layer having a magnetic permeability with an actual number portion of 3 to 45 in which a magnetic material is mixed, to each other, it is possible to obtain an electromagnetic interference suppression sheet suitable for high-density packaging of electronic equipments which is excellent in low-pass filter characteristic in a near electromagnetic field.

4 Claims, No Drawings

ELECTROMAGNETIC INTERFERENCE SUPPRESSOR

This application is the U.S. national phase of International Application No. PCT/JP2012/065243 filed 14 Jun. 2012 which designated the U.S. and claims priority to JP Patent Application No. 2011-135785 filed 17 Jun. 2011 and JP Patent Application No. 2012-072167 filed 27 Mar. 2012, the entire contents of each of which are hereby incorporated by reference.

TECHNICAL FIELD

The present invention relates to an electromagnetic interference suppressor for suppressing interference of unnecessary electromagnetic radiation generated from digital electronic devices which includes a conductive layer comprising a conductive filler and a magnetic layer comprising a magnetic filler, both the layers being laminated to each other.

BACKGROUND ART

In recent years, the progress of digital electronic devices has been noticeable. In particular, in mobile electronic devices such as typically cellular phones, digital cameras and clamshell type computers, there is a remarkably increasing demand for higher-frequency actuating signals as well as reduction in size and weight of these devices. Therefore, high-density packaging of electronic parts or wiring circuit boards in these devices is one of the most important technical tasks.

With the recent progress of high-density packaging of electronic parts or wiring circuit boards in electronic devices as well as use of higher-frequency actuating signals therefor, it may be difficult to ensure an adequate distance between the electronic parts that generate noises and the other adjacent parts. For this reason, in order to suppress unnecessary radiation emitted from a microprocessor, LSI or a liquid crystal panel of the electronic devices, electromagnetic interference suppression sheets have been used. In the near electromagnetic filed applications as described above, absorption and reflection phenomena of electromagnetic radiation can be hardly analyzed by a transmission line theory unlike those in the conventionally known far electromagnetic field applications (in which the electromagnetic radiation is in the form of a plane wave) (refer to Osamu HASHIMOTO, "Trend of Wave Absorbers", Journal of the Institute of Electronics, Information and Communication Engineers, Vol. 86, No. 10, pp. 800-803, October, 2003). For this reason, the electromagnetic interference suppression sheets used in the near electromagnetic field applications have been often designed depending upon experiences of experts only. In recent years, as described in Patent Documents 1 and 2, electromagnetic interference suppression sheets of such a type in which flat magnetic metal particles as soft magnetic particles are blended in a resin, have been used for absorbing electromagnetic radiation in the near electromagnetic magnetic field. The method for evaluating characteristics of an electromagnetic interference (noise) suppression sheet has been standardized by IEC 623333-1 in 2006.

Hitherto, there is described an electromagnetic interference suppressor which comprises, as soft magnetic particles, flat Fe—Al—Si alloy particles having an average particle diameter of 10 μm in an amount of 90% by weight (Patent Document 1). In Patent Document 1, the content of the alloy particles in the electromagnetic interference suppressor is 58.9% by volume when calculated from a density of the alloy particles of 6.9 kg/L and a density of the resin component of 1.1 kg/L with respect to the compositions 1 and 3, and the electromagnetic interference suppressor has a thickness of 1.2 mm.

As the production method, there is described the "method for producing a magnetic sheet in which after a magnetic coating material obtained by dispersing flat magnetic metal particles in a resin and a solvent is applied onto a substrate having a release layer and then dried, the resulting dried coating film is released from the substrate to obtain the magnetic sheet" (Patent Document 2). In Examples of Patent Document 2, there is also described the magnetic shielding sheet having a dried film thickness of 120 μm in which Sendust particles are filled at a maximum filling percentage of 80% by weight (56.0% by volume when calculated from a density of the sendust particles of 6.9 kg/L and a density of the resin of 1.1 kg/L). This indicates that the above method described in Patent Document 2 can realize production of a thinner magnetic sheet as compared to that described in Patent Document 1. It is considered that the thus obtained thin magnetic sheet is more suitable for high-density packaging of electronic parts or wiring circuit boards.

Also, there is disclosed a relationship between a surface electrical resistance and noise suppression of the conductive layer (Nobuyuki HIRATSUKA "Soft Magnetic Materials for Noise Suppression and Applications thereof", May, 2008).

Further, there is also known a sheet comprising a conductive layer and a magnetic layer which are laminated to each other (Patent Documents 3 to 5 and 10).

In addition, there are known an electromagnetic interference suppression sheet produced by dispersing carbonyl iron particles in a resin (Patent Document 6), and an electromagnetic interference suppression sheet produced by dispersing a conductive carbon and a soft magnetic material in a resin (Patent Documents 7, 8 and 9).

CITATION LIST

Patent Literature

Patent Document 1: Japanese Patent Application Laid-Open (KOKAI) No. 7-212079
Patent Document 2: Japanese Patent Application Laid-Open (KOKAI) No. 2000-244171
Patent Document 3: Japanese Patent Application Laid-Open (KOKAI) No. 10-075088
Patent Document 4: Japanese Patent Application Laid-Open (KOKAI) No. 2002-198686
Patent Document 5: Japanese Patent Application Laid-Open (KOKAI) No. 2010-135701
Patent Document 6: Japanese Patent Application Laid-Open (KOKAI) No. 2006-196747
Patent Document 7: Japanese Patent Application Laid-Open (KOKAI) No. 2007-288006
Patent Document 8: Japanese Patent Application Laid-Open (KOKAI) No. 2007-129179
Patent Document 9: Japanese Patent Application Laid-Open (KOKAI) No. 2008-244358
Patent Document 10: Japanese Patent Application Laid-Open (KOKAI) No. 2010-153542

SUMMARY OF THE INVENTION

Problem to be Solved by the Invention

With the progress of reduction in size and weight of digital electronic devices, it has been strongly required to realize higher-density packaging of electronic parts and wiring circuit boards and provide an electromagnetic interference suppression sheet which has a smaller thickness and can exhibit a more excellent electromagnetic absorption performance and a less electromagnetic reflection in a near electromagnetic field. In general, as the thickness of an electromagnetic interference suppression sheet is reduced, an electromagnetic absorption performance thereof is deteriorated. Therefore, in order to provide the electromagnetic interference suppression sheet having a reduced thickness, it is required to increase a content of magnetic particles in the sheet and attain a high magnetic loss therein, and ensure practical flexibility and strength of the sheet. However, in order to increase a magnetic permeability of metal magnetic particles and a content thereof in the sheet, not only the use of a high-grade processing technology but also high-level design of the particles such as design of a shape of the magnetic material and design of a particle size distribution thereof as well as processing of the particles are required, and therefore the problem of high costs tends to occur.

In the methods described in Patent Documents 3 to 5, the conductive layer has merely a function of a reflection layer against electromagnetic radiation and exhibits a large reflection loss in a distributed constant circuit, and therefore there tends to occur attenuation of a high-frequency transmission signal therein.

Also, in the method described in Patent Document 6, attenuation of transmission signals in GHz bands tends to be hardly caused to a sufficient extent.

In addition, in the methods described in Patent Documents 7, 8 and 9, when increasing an amount of the conductive filler filled in the conductive layer, the electrical resistance thereof tends to be lowered, so that transmission characteristics in a low frequency region, i.e., a transmission signal region, tends to be deteriorated. Further, in Patent Document 9, since a large loss tends to occur at a frequency of not less than 800 MHz, the use of the suppression sheet is limited to the applications using a transmission signal having a frequency region of not more than 800 MHz.

In consequence, an object of the present invention is to provide an electromagnetic interference suppressor capable of exhibiting an excellent low-pass filter characteristic in a near electromagnetic field.

Means for Solving the Problem

The above object can be achieved by the following aspects of the present invention.

That is, according to the present invention, there is provided an electromagnetic interference suppressor comprising a conductive layer comprising a conductive filler and a resin, and a magnetic layer comprising soft magnetic particles and a resin, the conductive layer and the magnetic layer being laminated to each other, in which the conductive layer has a surface electrical resistance of 100 to 5000Ω/□ (Invention 1).

Also, according to the present invention, there is provided the electromagnetic interference suppressor as described in the above Invention 1, wherein an actual number portion of a complex magnetic permeability of the magnetic layer as measured at 100 MHz is 3 to 45 (Invention 2).

Also, according to the present invention, there is provided the electromagnetic interference suppressor as described in the above Invention 1 or 2, wherein the conductive filler is a conductive carbon, and a content of the conductive filler in the conductive layer is 5 to 25% by volume (Invention 3).

Also, according to the present invention, there is provided the electromagnetic interference suppressor as described in any one of the above Inventions 1 to 3, wherein the soft magnetic particles are formed of at least one material selected from the group consisting of carbonyl iron, magnetite, spinel ferrite and Sendust (Invention 4).

Also, according to the present invention, there is provided the electromagnetic interference suppressor as described in any one of the above Inventions 1 to 4, wherein the conductive layer having a thickness of 20 to 100 µm and the magnetic layer having a thickness of 50 to 200 µm are laminated to each other (Invention 5).

In addition, according to the present invention, there is provided the electromagnetic interference suppressor as described in any one of the above Inventions 1 to 5, wherein an transmission loss of the electromagnetic interference suppressor having a thickness of not more than 100 µm in a measurement using a microstripline fitted thereto is not more than 3 dB as measured at 500 MHz and not less than 10 dB as measured at 3 GHz (Invention 6).

Effect of the Invention

In accordance with the present invention, it is possible to obtain an electromagnetic interference suppressor capable of exhibiting an excellent low-pass filter characteristic in a near electromagnetic field.

PREFERRED EMBODIMENT FOR CARRYING OUT THE INVENTION

First, the electromagnetic interference suppressor according to the present invention is described.

The electromagnetic interference suppressor according to the present invention includes a conductive layer comprising a conductive filler and a resin, and a magnetic layer comprising soft magnetic particles and a resin which is laminated to the conductive layer.

The conductive layer used in the present invention is described below.

Suitable examples of the carbon used in the conductive layer of the present invention include conductive carbon black, fibrous carbon obtained by processing carbon fibers, and carbon nanotube. As the conductive carbon black, there are preferably used those conductive carbon blacks having a particle diameter of 20 to 60 nm and a BET specific surface area of 30 to 1300 $m^2/g$, more preferably, high-conductive carbon blacks with a hollow shell structure having a particle diameter of 30 to 40 nm and a BET specific surface area of 700 to 1300 $m^2/g$. Suitable examples of the fibrous carbon obtained by processing carbon fibers include milled fibers having a fiber length of 30 to 150 µm and cut fibers having a fiber length of 3 to 24 mm. As the carbon nanotube, there are preferably used those carbon nanotubes having a fiber diameter of 40 to 90 µm, a specific surface area of 16 to 28 $m^2/g$ and a purity of not less than 99%, more preferably those carbon nanotubes having a fiber diameter of 40 to 160 µm, a specific surface area of 16 to 34 $m^2/g$ and a purity of not less than 99.5%.

The amount of the conductive filler compounded in the conductive layer used in the present invention is preferably 5 to 25% by volume and more preferably 8 to 25% by volume. When the amount of the conductive filler compounded in the conductive layer is less than the above-specified range, the transmission loss S21 tends to be lowered. When the amount of the conductive filler compounded in the conductive layer is as large as more than the above-specified range, the surface electrical resistance of the conductive layer tends to be less than 100Ω/□, so that the transmission loss as measured at 500

MHz tends to be increased, and the low-pass characteristic tends to be deteriorated. Further, the resulting sheet also tends to be deteriorated in strength and flexibility.

The conductive layer used in the present invention preferably comprises a resin in an amount of 25 to 80% by volume. When the content of the resin in the conductive layer is less than 25% by volume, the resulting sheet tends to be deteriorated in flexibility. When the content of the resin in the conductive layer is more than 80% by volume, the surface electrical resistance of the conductive layer tends to be increased. The content of the resin in the conductive layer is more preferably 26 to 60% by volume and still more preferably 28 to 40% by volume.

Examples of the resin usable in the conductive layer of the present invention include a styrene-based elastomer, an olefin-based elastomer, a polyester-based elastomer, a polyamide-based elastomer, a urethane-based elastomer and a silicone-based elastomer. Specific examples of the styrene-based elastomer include SEBS (styrene-ethylene-butylene-styrene block copolymer) and the like. As the resin, there may also be used an acrylic resin, an epoxy resin, a phenol resin and a polyolefin resin. In addition, the above elastomer may be mixed with the acrylic resin, epoxy resin, phenol resin and polyolefin resin, etc., and used as the resin.

The conductive layer used in the present invention preferably comprises a flame retardant in an amount of 5 to 20% by volume. When the amount of the flame retardant compounded in the conductive layer is less than 5% by volume, the flame-retarding effect tends to be insufficient. When the amount of the flame retardant compounded in the conductive layer is more than 20% by volume, the resulting sheet tends to be deteriorated in electromagnetic wave absorption. Preferred examples of the flame retardant include melamine polyphosphate, magnesium hydroxide and hydrotalcite. Among these flame retardants, more preferred are magnesium hydroxide and melamine polyphosphate.

The conductive layer used in the present invention preferably comprises an antioxidant in an amount of 0.5 to 3% by volume. When the amount of the antioxidant compounded in the conductive layer is less than 0.5% by volume, an oxidation-resisting property of the conductive layer tends to be undesirably lowered. When the amount of the antioxidant compounded in the conductive layer is more than 3% by volume, the resulting sheet tends to be deteriorated in electromagnetic wave absorption. Preferred examples of the antioxidant include 2',3-bis[[3-[3,5-di-tert-butyl-4-hydroxyphenyl]propionyl]] propionohydrazide ("IRGANOX MD1024" produced by Ciba Specialty Chemicals Corp.) and the like. The antioxidant for resins may be appropriately selected from tetrakis[methylene-3-(3',5'-di-tert-butyl-4'-hydroxyphenyl) propionate], tris-(3,5-di-t-butyl-4-hydroxybenzyl)-isocyanurate and N.N'-hexamethylenebis(3,5-di-t-butyl-4-hydroxyhydrocinnamide) depending upon the kind of resin used. As the antioxidant for rubber-based resins, there may be suitably used CTPI N-cyclohexylthiophthalimide produced by Toray Industries Inc.

Meanwhile, the conductive layer used in the present invention may comprise magnetic particles such as magnetite, carbonyl iron and ferrite to control a high-frequency impedance of the conductive layer.

Next, the magnetic layer used in the present invention is described below.

The soft magnetic particles compounded in the magnetic layer used in the present invention is formed of at least one kind of particles selected from the group consisting of carbonyl iron, magnetite, spinel ferrite, Sendust, silicon steel, iron and the like. The shape of the soft magnetic particles may be any of a granular shape, a spherical shape, a fragment shape, an acicular shape and a flat shape.

The maximum particle diameter of the soft magnetic particles compounded in the magnetic layer used in the present invention is preferably not more than ⅓ time and more preferably not more than ⅕ time a thickness of the sheet. When the maximum particle diameter of the soft magnetic particles in the magnetic layer is more than ⅓ time a thickness of the sheet, the resulting electromagnetic interference suppression sheet tends to have a poor surface smoothness, and therefore tends to be deteriorated not only in adhesion to an electromagnetic radiation source but also in electromagnetic wave absorption performance.

Also, the soft magnetic particles used in the present invention preferably have a true density of 4.0 to 9.0 $g/cm^3$ and more preferably 5.0 to 8.0 $g/cm^3$.

The soft magnetic particles used in the present invention are not particularly limited, and may be subjected to surface treatments with a coupling agent such as a titanate-based coupling agent or a silane-based coupling agent, if required. The metal-based soft magnetic particles are preferably surface-treated with a phosphoric acid-based coupling agent. The amount of the coupling agent used for surface-treating the soft magnetic particles is 0.1 to 1.0% by weight based on the weight of the soft magnetic particles. When the amount of the coupling agent treated is less than 0.1% by weight, the soft magnetic particles tends to hardly exhibit a sufficient affinity to the resin, so that the resulting magnetic layer tends to fail to maintain a sufficient oxidation stability. When the amount of the coupling agent treated is more than 1.0% by weight, the resulting sheet tends to exhibit an excessively high impedance and therefore tends to be deteriorated in electromagnetic wave absorption performance. The amount of the coupling agent used for surface-treating the soft magnetic particles is preferably 0.1 to 0.5% by weight.

Examples of the titanate-based coupling agent include isopropyl tris(stearoyl)titanate, isopropyl tris(dioctyl pyrophosphate)titanate, isopropyl tri(N-aminoethyl/aminoethyl)titanate, tetraoctyl bis(ditridecyl phosphate)titanate, tetra(2-2-diallyloxymethyl-1-butyl) bis(ditridecyl)phosphate titanate, bis(dioctyl pyrophosphate)oxyacetate titanate and bis(dioctyl pyrophosphate)ethylene titanate.

Examples of the silane-based coupling agent include those suitable as a coupling agent for elastomers. Specific examples of the silane-based coupling agent include vinyl trichlorosilane, vinyl trimethoxysilane, vinyl triethoxysilane, 2-(3,4-epoxycyclohexyl)ethyl trimethoxysilane, 3-glycidoxypropyl trimethoxysilane, 3-glycidoxypropylmethyl diethoxysilane, 3-glycidoxypropyl triethoxysilane, 3-methacryloxypropylmethyl dimethoxysilane, 3-methacryloxypropyl trimethoxysilane, 3-methacryloxypropylmethyl diethoxysilane, 3-methacryloxypropyl triethoxysilane, 3-acryloxypropyl trimethoxysilane, N-2(aminoethyl) 3-aminopropylmethyl dimethoxysilane, N-2(aminoethyl) 3-aminopropyl trimethoxysilane, N-2(aminoethyl) 3-aminopropyl triethoxysilane, 3-aminopropyl trimethoxysilane, 3-aminopropyl triethoxysilane, 3-mercaptopropylmethyl dimethoxysilane, 3-mercaptopropyl trimethoxysilane and bis(triethoxysilylpropyl)tetrasulfide.

In addition, the metal-based soft magnetic particles may be surface-treated with a phosphoric acid-based compound. The amount of the phosphoric acid-based compound used for surface-treating the soft magnetic particles is 0.1 to 0.5% by weight in terms of phosphoric acid based on the weight of the soft magnetic particles. Further, the soft magnetic particles may be surface-treated with 0.1 to 1.0% by weight of the silane coupling agent. When the amount of phosphoric acid treated is less than 0.1% by weight, the soft magnetic particles tend to be deteriorated in oxidation stability. When the amount of phosphoric acid treated is more than 0.5% by weight, the soft magnetic particles tend to have a low magnetic permeability and therefore the resulting sheet tends to be deteriorated in electromagnetic interference suppression effect. The amount of the phosphoric acid-based compound used for surface-treating the soft magnetic particles is preferably 0.1 to 0.4% by weight.

The magnetic layer comprises the soft magnetic particles and a resin, and may further comprise the above flame retardant and antioxidant, etc.

The magnetic layer preferably comprises a resin in an amount of 24 to 45% by volume. When the content of the resin in the magnetic layer is less than 24% by volume, the resulting sheet tends to be brittle. When the content of the resin in the magnetic layer is more than 45% by volume, the resulting sheet tends to have a low magnetic permeability. The magnetic layer more preferably comprises the resin in an amount of 30 to 40% by volume.

The magnetic layer preferably comprises the soft magnetic particles in an amount of 35 to 65% by volume and more preferably 38 to 60% by volume.

The magnetic layer used in the present invention preferably comprises the flame retardant as used in the conductive layer in an amount of 5 to 20% by volume.

The magnetic layer used in the present invention preferably comprises the antioxidant as used in the conductive layer in an amount of 0.5 to 3% by volume.

The resin constituting the magnetic layer may also be selected from the same resins as used in the conductive layer. The resin used in the magnetic layer may be the same as or different from the resin used in the conductive layer, and the resin used in the magnetic layer is preferably the same as the resin used in the conductive layer.

In the present invention, the actual number portion of a complex magnetic permeability of the magnetic layer as measured at 100 MHz is preferably 3 to 45. When the actual number portion of a complex magnetic permeability of the magnetic layer as measured at 100 MHz is less than 3, the reflection loss tends to be increased, so that the transmission signal tends to be attenuated. When the actual number portion of a complex magnetic permeability of the magnetic layer as measured at 100 MHz is more than 45, the impedance of the circuit tends to become large, so that the reflection loss tends to be increased. The actual number portion of a complex magnetic permeability of the magnetic layer as measured at 100 MHz is more preferably 4 to 44 and still more preferably 8 to 42.

The electromagnetic interference suppressor according to the present invention is preferably in the form of a sheet having a thickness of not more than 200 μm. When the thickness of the electromagnetic interference suppressor is more than 200 μm, the electromagnetic interference suppressor tends to be too thick to be adapted for high-density packaging of electronic circuits. The thickness of the electromagnetic interference suppressor is more preferably not more than 150 μm, still more preferably 20 to 120 μm and further still more preferably 25 to 50 μm.

In the electromagnetic interference suppressor according to the present invention, the ratio between thicknesses of the conductive layer and the magnetic layer is not particularly limited, and assuming that the thickness of the conductive layer is 1, the ratio of the thickness of the conductive layer to the thickness of the magnetic layer is preferably 1:1 to 1:5 and more preferably 1:1 to 1:4.

In the electromagnetic interference suppressor according to the present invention, the thickness of the conductive layer is preferably 20 to 100 μm, and the thickness of the magnetic layer is preferably 50 to 200 μm.

In the electromagnetic interference suppressor according to the present invention, the order of lamination of the conductive layer and the magnetic layer is not particularly limited. However, it is preferred that the magnetic layer is disposed on a surface of the resulting laminate which is near to signals transmitted.

The electromagnetic interference suppressor according to the present invention has such a suitable low-pass filter characteristic that when measured using a microstripline fitted to an electromagnetic interference suppression sheet having a lamination thickness of 100 μm, the transmission loss is not more than 3 dB as measured at 500 MHz and not less than 10 dB as measured at 3 GHz. Also, in the electromagnetic interference suppressor according to the present invention, the magnetic layer can be processed more easily than those of a conventional magnetic single layer type. When the transmission loss as measured at 500 MHz is more than 3 dB, the transmission loss in the signal band tends to be increased, so that the actuating signal tends to be reduced. On the other hand, when the transmission loss as measured at 3 GHz is less than 10 dB, suppression of the n-order harmonic noise of the actuating signal tends to be insufficient. In the electromagnetic interference suppressor according to the present invention, it is more preferred that the transmission loss is not more than 2.5 dB as measured at 500 MHz and not less than 15 dB as measured at 3 GHz.

Next, the process for producing the electromagnetic interference suppressor according to the present invention is described.

The electromagnetic interference suppressor according to the present invention may be suitably produced by applying a coating material prepared by dispersing the above conductive filler and/or the above soft magnetic particles in the resin onto a substrate, adjusting a thickness of the resulting coating layer after dried, and thermally compressing the thus formed laminated conductive layer and magnetic layer together. Alternatively, the electromagnetic interference suppressor may also be produced by laminating the separately formed conductive layer and magnetic layer and then thermally compressing the resulting laminate. The method of using the coating material prepared is preferred because the respective fillers can be filled therein with a high density and can be uniformly dispersed therein.

The electromagnetic interference suppressor according to the present invention can be used for a flat cable for high-frequency signals, a connector for cables and a flexible printed circuit board. By using the electromagnetic interference suppressor according to the present invention, it can be expected to ensure high-density packaging of parts, decrease a size of a substrate and reduce noise-emitting sources of a wiring circuit board itself. With the above construction, higher-density packaging of electronic circuits can be achieved, thereby enabling reduction in driving voltage and increase in electric current flowing therethrough, and mounting a high-density circuit having a high noise resistance on a substrate.

EXAMPLES

The methods for measuring various properties as described in the following Examples, etc., are as follows.

True Density of Particles:

The true density of the particles was measured by the following method. That is, using a density meter "MULTIVOLUME DENSIMETER 1305 Model" manufactured by Micro-Melitecs Co., Ltd., 28 g (W) of the particles were charged in a metering cell thereof, and a helium gas pressure sample volume (V) of the particles was measured. The true density of the particles was calculated from the following formula:

$$\text{True density} = W/V \ (g/cm^3).$$

[Measurement of Low-Pass Filter Characteristic (Transmission Loss S21)]

A microstripline having a length of 75 mm, a width of 23 mm and a thickness of 35 μm as well as an impedance controlled to 50Ω was formed on a substrate and used for the measurement. The sheet separately prepared was cut to produce a test specimen having a width of 40 mm and a length of 50 mm.

The microstripline was connected to a network analyzer "N5230A" manufactured by Agilent Technologies Corp., t measure an S parameter of the microstripline. More specifically, the sheet as the test specimen was fitted to the microstripline such that the length direction of the microstripline was aligned with the length direction of the sheet. A 10 mm-thick foamed polystyrene plate having the same size as that of the sheet and an expansion ratio of 20 to 30 times was overlapped on the sheet, and further a load of 300 g was placed on the polystyrene plate to measure a transmission loss as an S parameter S21 (dB) over a frequency range of 10 MHz to 3 GHz.

[Measurement of Surface Electrical Resistance]

The surface electrical resistance of the conductive layer was measured by the method prescribed in JIS K 7194. The sheet having a thickness of not more than 100 μm was cut into 50 mm in square to measure a thickness thereof. Four pin probes of a resistivity meter "Loresta-GP MCP-T600" manufactured by Mitsubishi Chemical Corp., were pressed onto a central portion of the sheet to measure a surface electrical resistance thereof.

[Preparation of Molded Body]

A molded body for measurement of magnetic permeability was prepared as follows. That is, a magnetic layer was cut by a ring-shaped die having an outer diameter of 7 mm and an inner diameter of 3 mm to obtain 20 ring-shaped sheets. The thus obtained ring-shaped sheets were overlapped with each other in a die and compression-molded therein under a pressure of 0.1 MPa at a die temperature of 85° C. for 1 min to prepare a cylindrical doughnut-shaped molded body for measurement of a magnetic permeability having an outer diameter of 7 mm, an inner diameter of 3 mm and a thickness of 1.4 mm (molded body for a coaxial tube test).

[Measurement of Complex Magnetic Permeability]

Using a material constant measurement device, the obtained molded body was subjected to measurement of a complex magnetic permeability thereof to determine an actual number portion μ' of the complex magnetic permeability at a frequency of 100 MHz by a network analyzer.

[Measurement of Flame Retardancy]

The flame retardancy of the sheet as a self-extinguishing property thereof was evaluated by the vertical burn test according to a flammability standard UL94V. The measurement of the flame retardancy was conducted by the method according to UL94V. More specifically, a test specimen having a width of 12.5 mm and a length of 100 mm was prepared, and held in the vertical position. A flame of a burner was applied to a lower free end of the test specimen thus held in the vertical position for 10 sec, and then released therefrom. The extinguishing time that elapsed after release of the burner flame from the sheet until ceasing fire thereon was measured.

Example 1

Granular (grainy) magnetite ("MAT305" produced by Toda Kogyo Corp.; density: 5.0 g/cm$^3$), a styrene-based elastomer, a conductive carbon ("KETJENBLACK EC" produced by Ketjenblack International Co., Ltd.; density: 1.6 g/cm$^3$), a fibrous carbon ("TRAYCA TS12" produced by Toray Industries, Inc.; chopped fibers 006-C), melamine polyphosphate ("MPP-A" produced by Sanwa Chemical Co., Ltd.; density: 1.8 g/cm$^3$) as a flame retardant and magnesium hydroxide ("KISMA 5A" produced by Kyowa Chemical Co., Ltd.; density: 2.4 g/cm$^2$) were weighed in amounts of 40% by volume, 28% by volume, 8% by volume, 8% by volume, 8% by volume and 8% by volume, respectively, in terms of a volume percentage after removal of a solvent from the respective components, and added and mixed in a solution prepared by dissolving 20% by weight of the styrene-based elastomer (density: 0.9 g/cm$^3$) in cyclohexanone ("TF-4200E" produced by Hitachi Kasei Kogyo Co., Ltd.). The resulting mixture was stirred using a "Power Homogenizer" manufactured by SMT Corp., at a rotating speed of 15000 rpm for 60 min, thereby obtaining a slurry. At that time, ethyl cyclohexanone having the same volume as that of the elastomer solution was added to the slurry to control a viscosity of the slurry. The resulting slurry was subjected to vacuum defoaming treatment, and then applied onto a carrier film using a doctor blade, followed by drying the applied slurry to remove the solvent therefrom, thereby obtaining a sheet having a thickness of 50 μm. The thus obtained sheet was molded at a temperature of 120° C. under a pressure of 60 MPa for a pressing time of 2 min, and the carrier film was released from the resulting molded sheet, thereby obtaining a conductive layer having a thickness of 30 μm. The resulting sheet had a surface electrical resistance of 460Ω/□. Also, it was confirmed that the obtained sheet had a smooth surface and an excellent flexural property.

In the same manner as in the above procedure for production of the conductive layer, a styrene-based elastomer, Sendust-flattened magnetic particles having an average particle diameter of 50 μm (density: 6.9 g/cm$^3$), melamine polyphosphate ("MPP-A" produced by Sanwa Chemical Co., Ltd.; density: 1.8 g/cm$^3$) as a flame retardant and magnesium hydroxide ("KISMA 5A" produced by Kyowa Chemical Co., Ltd.; density: 2.4 g/cm$^3$) were weighed in amounts of 40% by volume, 44% by volume, 8% by volume and 8% by volume, respectively, in terms of a volume percentage after removal of a solvent from the respective components, and added and mixed in a solution prepared by dissolving 20% by weight of the styrene-based elastomer (density: 0.9 g/cm$^3$) in cyclohexanone ("TF-4200E" produced by Hitachi Kasei Kogyo Co., Ltd.). The resulting mixture was stirred using a "Power Homogenizer" manufactured by SMT Corp., at a rotating speed of 15000 rpm for 60 min, thereby obtaining a slurry. The resulting slurry was subjected to vacuum defoaming treatment, and then applied onto a carrier film using a doctor blade, followed by drying the applied slurry to remove the solvent therefrom, thereby obtaining a sheet having a thickness of 90 μm. The thus obtained sheet was molded at a temperature of 120° C. under a pressure of 60 MPa for a pressing time of 2 min, thereby obtaining a magnetic layer having a thickness of 70 μm. The resulting magnetic layer had a magnetic permeability μ' of 43 as measured at 100 MHz.

The conductive layer and magnetic layer prepared above were overlapped on each other to obtain a laminated sheet having a total thickness of 100 μm. The thus obtained sheet was subjected to measurement of an S parameter using a microstripline having a length of 75 mm, a width of 2.3 mm, a thickness of 35 μm and an impedance of 50Ω by a network analyzer. As a result of measuring a transmission loss S21, the resulting sheet exhibited such an excellent low-pass filter characteristic that the transmission loss S21 was 3 dB as measured at 500 MHz and 14 dB as measured at 3 GHz.

Meanwhile, a sheet produced by laminating a 50 μm-thick conductive layer obtained by applying and then drying a coating material therefor and a 70 μm-thick magnetic layer obtained by applying and then drying a coating material therefor and compression-molding the resulting laminate at 120° C. under a pressure of 60 MPa for 2 min exhibited a thickness and a low-pass filter characteristic similar to those of the above sheet.

Example 2

A conductive layer having a thickness of 30 μm after subjected to thermal compression-molding was produced in the same manner as in Example 1 except that the formulation was changed such that a conductive carbon ("KETJENBLACK EC" produced by Ketjenblack International Co., Ltd.; density: 1.6 g/cm$^3$), a fibrous conductive carbon (cut fibers "TRAYCA TS15" 006-C produced by Toray Industries, Inc.; density: 1.5), granular magnetite ("MAT305" produced by Toda Kogyo Corp.), melamine polyphosphate ("MPP-A" produced by Sanwa Chemical Co., Ltd.; density: 1.8 g/cm$^3$) as a flame retardant and magnesium hydroxide ("KISMA 5A" produced by Kyowa Chemical Co., Ltd.; density: 2.4) were used in amounts of 12.5% by volume, 12.5% by volume, 20% by volume, 8% by volume and 8% by volume, respectively. The thus obtained sheet had a surface electrical resistance of 100 Ω/□.

A magnetic layer having a thickness of 70 μm after subjected to press-molding was produced in the same manner as in Example 1 except that Sendust-flattened magnetic particles having an average particle diameter of 50 μm (density: 6.9) were used in an amount of 40% by volume, and the amount of the resin used was changed. The thus obtained sheet had a magnetic permeability μ' of 40 as measured at 100 MHz.

The conductive layer and the magnetic layer prepared above were laminated to each other in the same manner as in Example 1, thereby obtaining a laminated sheet having a total thickness of 100 μm. The obtained laminated sheet was subjected to measurement of a transmission loss (S21) using a microstripline. As a result, it was confirmed that S21 was 2.9 dB as measured at 500 MHz and 17 dB as measured at 3 GHz, and therefore the sheet had an excellent low-pass filter characteristic.

Example 3

A conductive layer having a thickness of 30 μm after subjected to press-molding was produced in the same manner as in Example 1 except that the formulation was changed such that a carbon nanotube ("NT-7" produced by Hodogaya Chemical Co., Ltd.; density: 1.5), granular magnetite ("MAT305" produced by Toda Kogyo Corp.), melamine polyphosphate ("MPP-A" produced by Sanwa Chemical Co., Ltd.; density: 1.8 g/cm$^3$) as a flame retardant and magnesium hydroxide ("KISMA 5A" produced by Kyowa Chemical Co., Ltd.; density: 2.4) were used in amounts of 5% by volume, 45% by volume, 10% by volume and 10% by volume, respectively. The thus obtained conductive layer had a surface electrical resistance of 4700 Ω/□.

A magnetic layer having a thickness of 70 μm after subjected to thermal compression-molding was produced in the same manner as in Example 1 except that carbonyl iron ("R1470" produced by International Specialty Products Inc.; density: 7.8) was used in an amount of 60% by volume, and the amount of the resin used was changed. The thus obtained magnetic layer had a magnetic permeability μ' of 7 as measured at 100 MHz.

The conductive layer and the magnetic layer prepared above were laminated to each other in the same manner as in Example 1, thereby obtaining a laminated sheet having a total thickness of 100 μm. The obtained laminated sheet was subjected to measurement of a transmission loss using a microstripline. As a result, it was confirmed that S21 was 2.1 dB as measured at 500 MHz and 11 dB as measured at 3 GHz, and therefore the sheet had an excellent low-pass filter characteristic.

Example 4

A conductive layer having a thickness of 30 μm after subjected to press-molding was produced in the same manner as in Example 1 except that the formulation was changed such that a carbon nanotube ("NT-7" produced by Hodogaya Chemical Co., Ltd.; density: 1.5), granular magnetite ("MAT305" produced by Toda Kogyo Corp.), melamine polyphosphate ("MPP-A" produced by Sanwa Chemical Co., Ltd.; density: 1.8 g/cm$^3$) as a flame retardant and magnesium hydroxide ("KISMA 5A" produced by Kyowa Chemical Co., Ltd.; density: 2.4) were used in amounts of 12.5% by volume, 35% by volume, 8% by volume and 8% by volume, respectively. The thus obtained conductive layer had a surface electrical resistance of 600 Ω/□.

A magnetic layer having a thickness of 70 μm after subjected to press-molding was produced in the same manner as in Example 1 except that Sendust-flattened magnetic particles having an average particle diameter of 50 μm (density: 6.9) were used in an amount of 38% by volume, and the amount of the resin used was changed. The thus obtained sheet had a magnetic permeability μ' of 25 as measured at 100 MHz.

The conductive layer and the magnetic layer prepared above were laminated to each other in the same manner as in Example 1, thereby obtaining a laminated sheet having a total thickness of 100 μm. The obtained laminated sheet was subjected to measurement of a transmission loss using a microstripline. As a result, it was confirmed that S21 was 2.7 dB as measured at 500 MHz and 12 dB as measured at 3 GHz, and therefore the sheet had an excellent low-pass filter characteristic.

Example 5

A conductive layer having a thickness of 30 μm after subjected to thermal compression-molding was produced in the same manner as in Example 1 except that the formulation in the sheet was changed such that a conductive carbon ("KETJENBLACK EC" produced by Ketjenblack International Co., Ltd.; density: 1.6 g/cm$^3$), a fibrous conductive carbon (cut fibers "TRAYCA TS15" 006-C produced by Toray Industries, Inc.; density: 1.5), melamine polyphosphate ("MPP-A" produced by Sanwa Chemical Co., Ltd.; density: 1.8 g/cm$^3$) as a flame retardant and magnesium hydroxide ("KISMA 5A" produced by Kyowa Chemical Co., Ltd.; density: 2.4) were used in amounts of 12.5% by volume, 12.5% by volume, 20% by volume and 20% by volume, respectively. The thus obtained conductive layer had a surface electrical resistance of 150 Ω/□.

A magnetic layer having a thickness of 70 μm after subjected to press-molding was produced in the same manner as in Example 1 except that soft ferrite particles ("BSN-714" produced by Toda Kogyo Corp.; density: 5.1) were used in an amount of 60% by volume, and the amount of the resin used was changed.

The conductive layer and the magnetic layer prepared above were laminated to each other in the same manner as in Example 1, thereby obtaining a laminated sheet having a total thickness of 100 μm. The thus obtained sheet had a magnetic permeability μ' of 4 as measured at 100 MHz. The resulting laminated sheet was subjected to measurement of a transmission loss using a microstripline. As a result, it was confirmed that S21 was 1.9 dB as measured at 500 MHz, and 13 dB as measured at 3 GHz, and therefore the sheet had an excellent low-pass filter characteristic.

Example 6

A conductive layer having a thickness of 25 μm after subjected to thermal compression-molding was produced in the same manner as in Example 1 except that the formulation in the sheet was changed such that the resin was replaced with the resin 2 (phenol-based thermosetting resin "115B" produced Tomoegawa Co., Ltd.), and a conductive carbon (carbon fibers "Raheama R-301" produced by Teijin Ltd.; density: 2.2 g/cm$^3$), melamine polyphosphate ("MPP-A" produced by Sanwa Chemical Co., Ltd.; density: 1.8 g/cm$^3$) as a flame retardant and magnesium hydroxide ("KISMA 5A" produced by Kyowa Chemical Co., Ltd.; density: 2.4) were used in amounts of 22% by volume, 3% by volume and 16% by volume, respectively. The thus obtained conductive layer had a surface electrical resistance of 100 Ω/□.

A magnetic layer having a thickness of 75 μm after subjected to press-molding was produced in the same manner as in Example 4 except that the resin was replaced with the resin 2 (phenol-based thermosetting resin "115B" produced Tomoegawa Co., Ltd.).

The conductive layer and the magnetic layer prepared above were laminated to each other in the same manner as in Example 1, thereby obtaining a laminated sheet having a total thickness of 100 μm. The thus obtained sheet had a magnetic permeability μ' of 25 as measured at 100 MHz. The resulting laminated sheet was subjected to measurement of a transmission loss using a microstripline. As a result, it was confirmed that S21 was 3.0 dB as measured at 500 MHz and 18 dB as measured at 3 GHz, and therefore the sheet had an excellent low-pass filter characteristic.

Example 7

The same procedure as in Example 1 was conducted except that melamine polyphosphate ("MPP-A" produced by Sanwa Chemical Co., Ltd.; density: 1.8 g/cm$^3$) as a flame retardant, magnesium hydroxide ("KISMA 5A" produced by Kyowa Chemical Co., Ltd.; density: 2.4) and granular magnetite ("MAT305" produced by Toda Kogyo Corp.; 5.0 g/cm$^3$) were not added, i.e., removed from the formulated composition of each of the conductive layer and the magnetic layer in the sheet, thereby producing the conductive layer and the magnetic layer, respectively. The resulting sheet had a thickness of 100 μm. The conductive layer had a surface electrical resistance of 110Ω/□, and the magnetic layer had a magnetic permeability of 25 as measured at 100 MHz. In addition, the resulting sheet was subjected to measurement of a transmission loss using a microstripline. As a result, it was confirmed that S21 was 3.0 dB as measured at 500 MHz and 17 dB as measured at 3 GHz, and therefore the sheet had an excellent low-pass filter characteristic.

Comparative Example 1

A single magnetic layer was produced in the same manner as in Example 1. Specifically, the magnetic particles were prepared by mixing two kinds of flat metal particles each comprising iron, aluminum and silicon at a weight ratio of 85:6:9 and having an aspect ratio of 15 to 20 and a density of 6.9 which had average particle diameters of 50 μm and 75 μm, respectively, were used, and the concentration of the slurry was controlled such that the volume of the magnetic layer obtained after removing a solvent therefrom by drying became 46% by volume, thereby obtaining a sheet having a thickness of 125 μm. Although the resulting sheet was subjected to thermal compression-molding at 120° C. under 60 MPa for 2 min, the thickness of the obtained sheet was 115 μm. Therefore, the sheet was subjected to thermal compression-molding at 130° C. under 90 MPa for 5 min to obtain a sheet having a thickness of 100 μm. The thus obtained sheet had a poor flexibility. Also, the sheet had a magnetic permeability μ' of 50 as measured at 100 MHz. Thus, it was confirmed that in order to obtain a single magnetic layer having a good low-pass filter characteristic in which the flat magnetic particles were filled with a high density, it has been required to preliminarily mix different kinds of magnetic particles which were different in average particle diameter from each other, increase a molding temperature and a molding pressure, and extend a pressing time, which results in complicated process and therefore is unsuitable for mass-production of the sheet.

The resulting single magnetic layer sheet was subjected to measurement of a transmission loss using a microstripline. As a result, it was confirmed that S21 was 3 dB as measured at 500 MHz and 14 dB as measured at 3 GHz, and therefore the sheet had an excellent low-pass filter characteristic.

Comparative Example 2

The same procedure as in Example 1 was conducted except that the conductive carbons were used in a total amount of 4% by volume, thereby obtaining a sheet. The obtained conductive layer had a surface electrical resistance as high as 9600Ω/□. The resulting laminated sheet was subjected to measurement of a transmission loss using a microstripline. As a result, it was confirmed that S21 was 1 dB as measured at 500 MHz and 1.5 dB as measured at 3 GHz, and therefore the sheet had a poor low-pass filter characteristic because of a very low transmission as measured at 3 GHz.

Comparative Examples 3 to 5

The same procedure as in Example 2 was conducted except that the magnetic particles shown in Table 2 and the formulation as shown in Table 1 were used, thereby obtaining sheets. Various properties of the resulting sheets are shown in Table 1.

The laminated sheets obtained in Comparative Examples 3 to 5 were subjected to measurement of a transmission loss using a microstripline. As a result, it was confirmed that these sheets were incapable of satisfying the requirement that S21 was not more than 3 dB as measured at 500 MHz and not less than 10 dB as measured at 3 GHz, and therefore had a poor low-pass filter characteristic.

Comparative Example 6

The single conductive layer sheet was produced in the same manner as in Example 5. The resulting sheet had a thickness of 30 μm and a surface electrical resistance of 150Ω/□. The resulting sheet was subjected to measurement of a transmission loss S21. As a result, it was confirmed that S21 was 3.5 dB as measured at 500 MHz and 13 dB as measured at 3 GHz. As a result, the transmission signal was reduced owing to a large transmission loss as measured at a low frequency of 500 MHz.

Comparative Example 7

The same procedure as in Comparative Example 6 was conducted except that the conductive filler used was changed, thereby obtaining a single conductive layer sheet. Various properties of the resulting sheet are shown in Table 1.

Comparative Example 8

A single layer sheet (having a thickness of 100 μm) was produced in the same manner as used for production of the conductive layer in Example 1 except that carbonyl iron ("R1470" produced by International Specialty Products Inc.; density: 7.8 cm$^3$), a styrene-based elastomer, a conductive carbon ("KETJENBLACK EC" produced by Ketjenblack International Co., Ltd.; density: 1.6 g/cm$^3$) and a fibrous carbon ("TRAYCA TS12" produced by Toray Industries, Inc.; chopped fibers 006-C) were weighed in amounts of 50% by volume, 24% by volume, 4% by volume and 6% by volume, respectively, in terms of a volume percentage after removal of a solvent from the respective components, and added and mixed in a solution prepared by dissolving 20% by weight of the styrene-based elastomer (density: 0.9 g/cm$^3$) in cyclohexanone ("TF-4200E" produced by Hitachi Kasei Kogyo Co., Ltd.). The resulting sheet had a surface electrical resistance of 250Ω/□. The resulting sheet was subjected to measurement of a transmission loss S21. As a result, it was confirmed that S21 was 3.6 dB as measured at 500 MHz and 14 dB as measured at 3 GHz. As a result, it was confirmed that the transmission signal was reduced owing to a large transmission loss as measured at a low frequency of 500 MHz.

TABLE 1

| Examples and Comparative Examples | Conductive layer | | | | |
|---|---|---|---|---|---|
| | Carbon | | | | Magnetite MAT305 |
| | Grainy | Fiber 1 | Fiber 2 | Nano tube | |
| Example 1 | 8 | 8 | | | 40 |
| Example 2 | 12.5 | 12.5 | | | 20 |
| Example 3 | | | | 5 | 45 |
| Example 4 | | | | 12.5 | 35 |
| Example 5 | 12.5 | 12.5 | | | |
| Example 6 | | | 22 | | 26 |
| Example 7 | | | 22 | | |
| Comparative Example 1 | | | | | 40 |
| Comparative Example 2 | 2 | 2 | | | 45 |
| Comparative Example 3 | | | | 4 | 45 |
| Comparative Example 4 | 20 | 20 | | | 20 |
| Comparative Example 5 | | | | | 45 |
| Comparative Example 6 | 12.5 | 12.5 | | | |
| Comparative Example 7 | 12.5 | 12.5 | | | |
| Comparative Example 8 | 4 | 6 | | | 50[*1] |

Note:
The balance (remainder of total volume percentage of the above components) was an amount of a resin used.
[*1]Carbonyl iron "R1470" was used instead of magnetite.

| Examples and Comparative Examples | Conductive layer | | | | |
|---|---|---|---|---|---|
| | Flame retardant | | Total amount of fillers (vol %) | Surface electrical resistance (Ω/□) | Sheet thickness (μm) |
| | MP[*2] | Mg(OH)$_2$ | | | |
| Example 1 | 8 | 8 | 72 | 460 | 30 |
| Example 2 | 8 | 8 | 61 | 100 | 30 |
| Example 3 | 10 | 10 | 70 | 4700 | 40 |
| Example 4 | 8 | 8 | 63.5 | 600 | 30 |
| Example 5 | 20 | 20 | 65 | 150 | 30 |
| Example 6 | 3 | 16 | 67 | 105 | 25 |
| Example 7 | | | 22 | 110 | 25 |
| Comparative Example 1 | | | | | |
| Comparative Example 2 | 8 | 8 | 60 | 9600 | 30 |
| Comparative Example 3 | 8 | 8 | 65 | 5200 | 30 |
| Comparative Example 4 | | | 60 | 70 | 30 |
| Comparative Example 5 | 8 | 8 | 61 | ≥10000 | 30 |
| Comparative Example 6 | 20 | 20 | 65 | 150 | 30 |
| Comparative Example 7 | | | 25 | 155 | 30 |
| Comparative Example 8 | 8 | 8 | 76 | 250 | 100 |

Note:
[*2]Melamine phosphate

| Examples and Comparative Examples | Magnetic layer | | | | |
|---|---|---|---|---|---|
| | Carbonyl iron | Ferrite | Flat Sendust | | Sheet thickness (μm) |
| | R1470 | BSN714 | (A) | (B) | MAT305 |
| Example 1 | | | 44 | | 70 |
| Example 2 | | | 40 | | 70 |
| Example 3 | 60 | | | | 60 |
| Example 4 | | | 38 | | 70 |
| Example 5 | | 60 | | | 70 |
| Example 6 | | | 38 | | 75 |
| Example 7 | | | 38 | | 75 |
| Comparative Example 1 | | | | 46 | 100 |
| Comparative Example 2 | | | 44 | | 70 |
| Comparative Example 3 | 60 | | | | 70 |
| Comparative Example 4 | | | 44 | | 70 |
| Comparative Example 5 | | 60 | | | 70 |
| Comparative Example | | | | | 0 |

TABLE 1-continued

| Examples and Comparative Examples | Magnetic layer Magnetic permeability at 100 MHz | Thickness (μm) | S21 (dB) At 500 MHz | S21 (dB) At 3 GHz | Flame retardancy (UL94V) Combustion time (sec) |
|---|---|---|---|---|---|
| Example 6 | | | | 44 | 0 |
| Comparative Example 7 | | | | | 0 |
| Comparative Example 8 | | | | | |
| Example 1 | 43 | 100 | 2.5 | 14 | 15 |
| Example 2 | 40 | 100 | 2.9 | 17 | 14 |
| Example 3 | 7 | 100 | 2.1 | 11 | 13 |
| Example 4 | 25 | 100 | 2.7 | 12 | 16 |
| Example 5 | 4 | 100 | 1.9 | 13 | 9 |
| Example 6 | 25 | 100 | 3.0 | 18 | 14 |
| Example 7 | 25 | 100 | 3.0 | 17 | Burned |
| Comparative Example 1 | 50 | 100 | 3 | 14 | |
| Comparative Example 2 | 43 | 100 | 1 | 1.5 | |
| Comparative Example 3 | 7 | 100 | 1.5 | 8 | |
| Comparative Example 4 | 43 | 100 | 7 | 17 | |
| Comparative Example 5 | 4 | 100 | 0.5 | 2 | |
| Comparative Example 6 | 43 | 30 | 3.5 | 13 | |
| Comparative Example 7 | 43 | 30 | 3.5 | 13 | |
| Comparative Example 8 | 5 | 100 | 3.6 | 14 | |

TABLE 2

| Carbon | | Density |
|---|---|---|
| Fiber 1 | "TRAYCA CUT FIBER TS12 006-C" (6 mm fiber) produced by Toray Industries, Inc. | 1.5 |
| Fiber 2 | Carbon fibers "Raheama R-B301" produced by Teijin Ltd. (200 μm fiber) | 2.2 |
| Nanotube | "NT-7" produced by Hodogaya Chemical Co., Ltd. | 1.5 |
| Grainy | KETJENBLACK EC" produced by Ketjenblack International Co., Ltd. | 1.6 |
| Magnetite | "MAT305" produced by Toda Kogyo Corp. | 5.0 |
| Ferrite | "BSN-714" produced by Toda Kogyo Corp. | 5.1 |
| Carbonyl iron powder | ISP Japan Co., Ltd. | |
| Flat metal particles SENDUST (A) | FeAlSi 85:6:9 D50: 50 μm | 6.9 |
| Flat metal particles SENDUST (B) | FeAlSi 85:6:9 D50: 75 μm:50 μm = 1:2 (as mixed particles) | 6.9 |
| Flame retardant | Magnesium hydroxide "KISMA 5A" produced by Kyowa Chemical Co., Ltd. | 2.4 |
| | Melamine polyphosphate "MPP-A" produced by Sanwa Chemical Co., Ltd. | 1.8 |
| Resin 1 | Styrene-based elastomer "TF-4200E" produced by Hitachi Kasei Kogyo Co., Ltd. | 0.9 |
| Resin 2 | Phenol-based resin "115B" produced Tomoegawa Co., Ltd. | 1.1 |

INDUSTRIAL APPLICABILITY

The electromagnetic interference suppressor according to the present invention can exhibit excellent properties even when the sheet has a low magnetic permeability. Thus, the electromagnetic interference suppressor according to the present invention is excellent in low-pass filter characteristic in a near electromagnetic field and therefore suitable as an electromagnetic interference suppression sheet.

The invention claimed is:

1. An electromagnetic interference suppressor consisting of:
    a conductive layer comprising a conductive filler and a resin, and
    a magnetic layer comprising soft magnetic particles and a resin,
    the conductive layer and the magnetic layer being laminated to each other, in which the conductive layer has a surface electrical resistance of 100 to 5000 Ω/□,
    wherein the conductive filler is a conductive carbon, and a content of the conductive filler in the conductive layer is 5 to 25% by volume, and
    wherein a transmission loss of the electromagnetic interference suppressor having a thickness of not more than 100 μm in a measurement using a microstripline fitted thereto is not more than 3 dB as measured at 500 MHz and not less than 10 dB as measured at 3 GHz.

2. The electromagnetic interference suppressor according to claim 1, wherein an actual number portion of a complex magnetic permeability of the magnetic layer as measured at 100 MHz is 3 to 45.

3. The electromagnetic interference suppressor according to claim 1, wherein the soft magnetic particles are formed of at least one material selected from the group consisting of carbonyl iron, magnetite, spinel ferrite and Sendust.

4. The electromagnetic interference suppressor according to claim 1, wherein the conductive layer having a thickness of 20 to 100 μm and the magnetic layer having a thickness of 50 to 200 μm are laminated to each other.

* * * * *